US011242619B2

(12) United States Patent
Bai et al.

(10) Patent No.: US 11,242,619 B2
(45) Date of Patent: Feb. 8, 2022

(54) NANO-TWINNED COPPER LAYER, METHOD FOR MANUFACTURING THE SAME, AND SUBSTRATE COMPRISING THE SAME

(71) Applicant: CHEMLEADER CORPORATION, Hsinchu County (TW)

(72) Inventors: Chih-Hung Bai, Hsinchu County (TW); Yao-Tsung Chen, Hsinchu County (TW); Zong-Cyuan Chen, Hsinchu County (TW); Shih-Chun Chung, Hsinchu County (TW)

(73) Assignee: CHEMLEADER CORPORATION, Hsinchu County (TW)

( * ) Notice: Subject to any disclaimer, the term of this patent is extended or adjusted under 35 U.S.C. 154(b) by 0 days.

(21) Appl. No.: 17/097,033

(22) Filed: Nov. 13, 2020

(65) Prior Publication Data
US 2021/0172086 A1 Jun. 10, 2021

(30) Foreign Application Priority Data

Dec. 6, 2019 (TW) .................................. 108144788

(51) Int. Cl.
*B32B 15/00* (2006.01)
*C30B 29/60* (2006.01)
*C30B 29/10* (2006.01)
*C30B 7/12* (2006.01)
*C25D 5/00* (2006.01)
(Continued)

(52) U.S. Cl.
CPC .............. *C30B 29/605* (2013.01); *C25D 3/38* (2013.01); *C25D 5/617* (2020.08); *C30B 7/12* (2013.01); *C30B 29/10* (2013.01); *H01B 5/14* (2013.01); *H01L 23/49866* (2013.01); *H05K 1/09* (2013.01)

(58) Field of Classification Search
None
See application file for complete search history.

(56) References Cited

U.S. PATENT DOCUMENTS 7,736,448 B2   6/2010 Lu et al.
9,476,140 B2  10/2016 Chen et al.
(Continued)

FOREIGN PATENT DOCUMENTS

TW   201347111 A   11/2013
TW   201432828 A    8/2014

OTHER PUBLICATIONS

René Winand, "Electrodeposition of metals and alloys—new results and perspectives". Electrochimica Acta, vol. 39, No. 8/9, pp. 1091-1105, 1994.
(Continued)

*Primary Examiner* — Seth Dumbris
(74) *Attorney, Agent, or Firm* — Bacon & Thomas, PLLC

(57) ABSTRACT

A nano-twinned copper layer is disclosed, wherein over 50% of a volume of the nano-twinned copper layer comprises a plurality of columnar crystal grains, the plurality of columnar crystal grains connect to each other, at least 70% of the plurality of columnar crystal grains are formed by a plurality of nano-twins stacking in an orientation of a crystal axis, and an angle included between two adjacent columnar crystal grains is greater 20° and less than or equal to 60°. In addition, a method for manufacturing the nano-twinned copper layer and a substrate comprising the same are also disclosed.

16 Claims, 8 Drawing Sheets

(51) Int. Cl.
*C25D 3/38* (2006.01)
*H01L 23/498* (2006.01)
*H05K 1/09* (2006.01)
*H01B 5/14* (2006.01)

(56) References Cited

U.S. PATENT DOCUMENTS

2013/0122326 A1* 5/2013 Chen .................... C30B 29/605
                                                                428/641
2013/0302646 A1* 11/2013 Chen ................... H01L 21/4846
                                                                428/674
2014/0217593 A1* 8/2014 Chen ....................... H01L 24/81
                                                                257/762
2016/0355940 A1* 12/2016 Chen ......................... C30B 7/12
2020/0083539 A1* 3/2020 Chen ......................... C25D 1/04
2020/0236782 A1* 7/2020 Ho .................... H01L 23/49866

OTHER PUBLICATIONS

Maxime Mieszala, Gaylord Guillonneau, Madoka Hasegawa, Rejin Raghavan, Jeffrey M. Wheeler, Stefano Mischler, Johann Michler, and Laetitia Philippe, "Orientation-dependent mechanical behaviour of electrodeposited copper with nanoscale twins", Nanoscale, 2016, 8, 15999-16004.
"Development of the High Tensile Strength and the High Thermal Stability Copper Foil NC-TSH", Furukawa Electric Review, No. 49 2018.
Z.S. You, L. Lu, K. Lu, "Tensile behavior of columnar grained Cu with preferentially oriented nanoscale twins", Acta Materialia 59 (2011) 6927-6937.

* cited by examiner

NANO-TWINNED COPPER LAYER, METHOD FOR MANUFACTURING THE SAME, AND SUBSTRATE COMPRISING THE SAME

CROSS REFERENCE TO RELATED APPLICATION

This application claims the benefits of the Taiwan Patent Application Serial Number 108144788, filed on Dec. 6, 2019, the subject matter of which is incorporated herein by reference.

BACKGROUND

1. Field

The present disclosure relates to a nano-twinned copper layer, a method for manufacturing the same and a substrate comprising the same. In particular, the present disclosure relates to a nano-twinned copper layer with specific crystal grains arrangement, a method for manufacturing the same and a substrate comprising the same.

2. Description of Related Art

The reliability of electronic devices is mainly related to the anti-electromigration ability of conductive lines. One developed method that can improve the anti-electromigration ability of the conductive lines is to add the nano-twinned metal structures into the conductive lines. Thus, when the metal ions are electromigrated along the flow direction of the electrons, the twin boundaries in the nano-twinned metal structures can delay the loss rate of the electomigrated metal ions. Thus, the formation rate of voids in the conductive lines can be reduced, and the lifetime of the electronic devices can be improved. In other words, the anti-electromigration ability of the conductive lines can be raised as more nano-twinned metal structures are comprised in the conductive lines.

In the current known nano-twinned copper structure, the nano-twinned crystal grains are columnar crystal grains upright grown on the surface. Even though this kind of nano-twinned copper structure has good property, a novel nano-twinned copper structure is also desired which has the properties different from those of the current known nano-twinned copper structure to provide another option for the electronic devices.

SUMMARY

The present disclosure relates to a nano-twinned copper layer, a method for manufacturing the same and a substrate comprising the same, wherein the nano-twinned copper layer has better elongation rate, and the reliability of the electronic products using the nano-twinned copper layer can be greatly improved.

The present disclosure provides a nano-twinned copper layer, wherein over 50% of a volume of the nano-twinned copper layer comprises a plurality of columnar crystal grains, the plurality of columnar crystal grains connect to each other, at least 70% of the plurality of columnar crystal grains are formed by a plurality of nano-twins stacking in an orientation of a [111] crystal axis, and an angle included between two adjacent columnar crystal grains is greater 20° and less than or equal to 60°.

In the conventional nano-twinned copper layer with (111) columnar crystal grains, angles included between adjacent columnar crystal grains are mostly around 0°. In the novel nano-twinned copper layer provided by the present disclosure, the angle included between two adjacent columnar crystal grains can be greater 20° and less than or equal to 60°, so the structure of the nano-twinned copper layer of the present disclosure is different from the structure of the conventional nano-twinned copper layer. In addition, the experimental results indicate that the elongation rate of the nano-twinned copper layer in which the angle included between two adjacent columnar crystal grains can be greater 20° and less than or equal to 60° is better than the elongation rate of the nano-twinned copper layer in which the angles included between adjacent columnar crystal grains are mostly around 0°. Hence, the nano-twinned copper layer provided by the present disclosure has not only excellent anti-electromigration ability and mechanical property but also better elongation rate compared to the conventional nano-twinned copper layer (in which the angles included between adjacent columnar crystal grains are mostly around 0°). Thus, the application fields of the nano-twinned copper layer of the present disclosure can further be extended.

In the present disclosure, at least 70% of the columnar crystal grains has a longitude axis, which is the stacking direction (i.e. the growth direction) of the nano-twins. The nano-twinned copper layer has a thickness direction, which is normal to a surface of the nano-twinned copper layer. Herein, an angle included between the [111] crystal axis of the columnar crystal grains and the longitude axis is greater than or equal to 0° but less than or equal to 20°. In other words, an angle included between the [111] crystal axis of the columnar crystal grains and the stacking direction (i.e. the growth direction) of the nano-twins is greater than or equal to 0° but less than or equal to 20°. In addition, an angle included between the direction of the longitude axis of one of the columnar crystal grains and the thickness direction of the nano-twinned copper layer is greater than 20° but less than or equal to 60°. In one example of the present disclosure, the angle included between the [111] crystal axis of the columnar crystal grains and the stacking direction (i.e. the growth direction) of the nano-twins is substantially about 0°.

In the present disclosure, the thickness of the nano-twinned copper layer can be adjusted according to the need. In one example of the present disclosure, the thickness of the nano-twinned copper layer can be ranged from 0.1 µm to 500 µm. In another example of the present disclosure, the thickness of the nano-twinned copper layer can be ranged from 0.8 µm to 200 µm. In further example of the present disclosure, the thickness of the nano-twinned copper layer can be ranged from 1 µm to 20 µm. However, the present disclosure is not limited thereto.

In the present disclosure, at least 70% of the columnar crystal grains in the nano-twinned copper layer are formed by stacking a plurality of nano-twins. In one example of the present disclosure, at least 90% of the columnar crystal grains in the nano-twinned copper layer are formed by stacking a plurality of nano-twins. In another example of the present disclosure, the columnar crystal grains in the nano-twinned copper layer are almost formed by stacking a plurality of nano-twins.

In the present disclosure, at least 70% of the plurality of columnar crystal grains in the nano-twinned copper layer are formed by a plurality of nano-twins stacking in the orientation of the [111] crystal axis. In one example of the present disclosure, at least 90% of the plurality of columnar crystal grains in the nano-twinned copper layer are formed by a plurality of nano-twins stacking in the orientation of the [111] crystal axis. In another example of the present disclosure, each of the plurality of columnar crystal grains in the nano-twinned copper layer is formed by a plurality of nano-twins stacking in the orientation of the [111] crystal axis.

In the present disclosure, lengths of the plurality of columnar crystal grains in the nano-twinned copper layer on a minor axis are respectively ranged from 0.1 μm to 50 μm. In one example of the present disclosure, the lengths of the plurality of columnar crystal grains on the minor axis can be respectively ranged from 0.1 μm to 30 μm. In another example of the present disclosure, the lengths of the plurality of columnar crystal grains on the minor axis can be respectively ranged from 0.1 μm to 20 μm. In further another example of the present disclosure, the lengths of the plurality of columnar crystal grains on the minor axis can be respectively ranged from 0.1 μm to 10 μm. In the present disclosure, the term "the length of the columnar crystal grain on the minor axis" refers to the length of the columnar crystal grain at a direction substantially perpendicular to the stacking direction of the columnar crystal grain. In addition, the term "substantially perpendicular" means the angle included between two directions can be ranged from 85° to 90°, and preferably is 90°. Furthermore, in one example of the present disclosure, the term "the length of the columnar crystal grain on the minor axis" can be referred to the width of the columnar crystal grain.

In the present disclosure, the thicknesses of the columnar crystal grains in the nano-twinned copper layer can be respectively ranged from 0.01 μm to 500 μm. In one example of the present disclosure, the thicknesses of the columnar crystal grains can be respectively ranged from 0.1 μm to 200 μm. In another example of the present disclosure, the thicknesses of the columnar crystal grains can be respectively ranged from 0.1 μm to 150 μm. In further another example of the present disclosure, the thicknesses of the columnar crystal grains can be respectively ranged from 0.1 μm to 100 μm. In further another example of the present disclosure, the thicknesses of the columnar crystal grains can be respectively ranged from 1 μm to 50 μm.

The nano-twinned copper layer of the present disclosure can be manufactured by an electrodeposition process. Herein, the present disclosure provides a method for manufacturing the aforesaid nano-twinned copper layer, which comprises the following steps: providing an electrodepositing system, which comprises an anode, a cathode, a plating solution and a power supply, wherein the power supply is electrically connected to the anode and the cathode, and the anode and the cathode are immersed in the plating solution; performing electrodeposition at a first current density, which is 0.8 to 1.0 times of a limiting current density of the electrodepositing system; and performing electrodeposition at a second current density, which is 0.1 to 0.6 times of the limiting current density of the electrodepositing system, to grow the aforesaid nano-twinned copper layer on a surface of the cathode. Herein, the plating solution comprises: a copper ion source, an acid and a chloride ion source.

In the method of the present disclosure, the electrodeposition is firstly carried out at a higher current density (i.e. the first current density), which is a more suitable electrodeposition condition for the nuclei formation than the film formation. Then, the electrodeposition is carried out at a lower current density (i.e. the second current density), which is a more suitable electrodeposition condition for the film formation than the nuclei formation. Thus, the nano-twinned copper layer of the present disclosure in which an angle included between two adjacent columnar crystal grains is greater 20° and less than or equal to 60° can be obtained.

In particular, when the electrodeposition is carried out at a higher current density (i.e. the first current density), the Cu ions in the plating solution are rapidly accumulated on the surface of the cathode to form a seed layer. The seed layer may comprise plural Cu nuclei (even nano-twinned Cu nuclei). When the Cu ions are rapidly accumulated on the surface of the cathode to form the Cu nuclei, a Cu ion concentration gradient may be formed in the plating solution in the electrolytic tank, wherein the Cu ion concentration is lowest at the surface of the cathode and gradually increased away from the surface of the cathode. In addition, the formed Cu nuclei are particles, so the Cu ion concentration gradient may be in a spherical or hemispherical distribution. After forming the seed layer comprising the Cu nuclei, the electrodeposition is carried out at a lower current density (i.e. the second current density), and the nano-twinned copper crystal grains are growth and stacked from the surface of the Cu nuclei. At this time, the growth of the nano-twinned copper crystal grains is performed along a normal direction of the spherical or hemispherical Cu ion concentration gradient, so the angle included between two adjacent columnar crystal grains is comparatively large. Then, the electrodeposition is continuously carried out at the lower current density (i.e. the second current density), the Cu ion concentrations in different regions of the electrolytic tank is not much different (even the same) as the time passes, and thus the nano-twinned Cu crystal grains can be formed steadily and continuously.

In the plating solution, the maximum current density for forming electrodeposited Cu is defined by the situation that the maximum rate that the Cu ions can be supplied to the surface of the cathode, and the maximum current density is called as the limiting current density. The limiting current density is related to the Cu ion concentration, the stirring rate and the temperature of the plating solution. In order to form the Cu ion concentration gradient on the surface of the cathode, the applied current may be varied according to the different Cu ion concentration, the stirring rate and the temperature of the plating solution, which is highly related to the levels of the limiting current density. Thus, in the present disclosure, the ratio of the limiting current density to the first/second current density is used to define the required current density for the electrodeposition.

In the method of the present disclosure, a ratio of the first current density to the limiting current density can be ranged from 0.8 to 1.0. In an example of the present disclosure, the ratio of the first current density to the limiting current density can be ranged from 0.8 to 0.95.

In the method of the present disclosure, a ratio of the second current density to the limiting current density can be ranged from 0.1 to 0.6. In an example of the present disclosure, the ratio of the second current density to the limiting current density can be ranged from 0.2 to 0.6.

In the method of the present disclosure, a time for the electrodeposition at the first current density can be ranged from 1 second to 20 seconds. In one example of the present disclosure, the time for the electrodeposition at the first current density can be ranged from 1 second to 10 seconds. Herein, the time for the electrodeposition at the first current density cannot be too long. If the time is too long, it is difficult to obtain the nano-twinned copper layer in which the angle included between two adjacent columnar crystal grains is greater 20° and less than or equal to 60°. As for the time for the electrodeposition at the second current density, it can be adjusted according to the required thickness of the nano-twinned copper layer and is not particularly limited.

In the method of the present disclosure, when the electrodeposition is carried out at a higher current density (i.e. the first current density), a seed layer can be formed. Hence, the nano-twinned copper layer of the present disclosure may further comprise a seed layer, and a volume of the seed layer can be 1% to 50%, 1% to 30% or 1% to 10% of the nano-twinned copper layer.

In the method of the present disclosure, the chloride ions can be used to fine the growth direction of the crystal grains to make the nano-twins Cu crystal grain have preferred direction. The acid can be an organic acid or an inorganic acid to increase the concentration of the electrolyte and increase the electrodeposition rate. Examples of the acid can be sulfuric acid, methanesulfonic acid or combination thereof. The concentration of the acid in the plating solution can be ranged from 80 g/L to 120 g/L. In addition, the copper ion source can be a copper salt, for example, copper sulfate or copper methylsulfonate. The concentration of the Cu ions in the plating solution can be ranged from 20 g/L to 100 g/L. In one example of the present disclosure, the concentration of the Cu ions in the plating solution can be ranged from 30 g/L to 80 g/L. In another example of the present disclosure, the concentration of the Cu ions in the plating solution can be ranged from 40 g/L to 70 g/L. If the concentration of the Cu ions is too high, it is difficult to obtain the nano-twinned copper layer in which the angle included between two adjacent columnar crystal grains is greater 20° and less than or equal to 60°. Furthermore, the plating solution may further selectively comprise an additive, for example, gelatin, surfactants or lattice modification agents.

In the method of the present disclosure, the electrodeposition can be carried out by direct current electrodeposition, pulse electrodeposition, or both interchangeably.

In the method of the present disclosure, the cathode or the plating solution can be stirred at 50 to 1500 rpm during the electrodeposition to improve the growth direction and growth rate of the crystal grains.

In the method of the present disclosure, the cathode can be a substrate with a metal layer formed thereon or a metal substrate. For example, the substrate can be a silicon substrate, a glass substrate, a quartz substrate, a metal substrate, a plastic substrate, a printed circuit board, a III-V group material substrate, or a laminated substrate thereof.

Thus, the present disclosure further provides a substrate with a nano-twinned copper layer, which comprises: a substrate; and the aforesaid nano-twinned copper layer disposed on a surface of the substrate or embedded in the substrate. The example of the substrate is described above and the description thereof is not repeated again.

In the present disclosure, the nano-twinned copper layer has excellent mechanical property, anti-electromigration ability and elongation rate, and thus can be used in through silicon vias, pin through holes of packaging substrates, various metal lines, or substrate circuits of 3D-IC, and is benefit to the development of the integrated circuit industry.

Other novel features of the disclosure will become more apparent from the following detailed description when taken in conjunction with the accompanying drawings.

DETAILED DESCRIPTION OF EMBODIMENT

Different embodiments of the present disclosure are provided in the following description. These embodiments are meant to explain the technical content of the present disclosure, but not meant to limit the scope of the present disclosure. A feature described in an embodiment may be applied to other embodiments by suitable modification, substitution, combination, or separation.

It should be noted that, in the present specification, when a component is described to have an element, it means that the component may have one or more of the elements, and it does not mean that the component has only one of the element, except otherwise specified.

Moreover, in the present specification, the ordinal numbers, such as "first" or "second", are used to distinguish a plurality of elements having the same name, and it does not means that there is essentially a level, a rank, an executing order, or an manufacturing order among the elements, except otherwise specified. A "first" element and a "second" element may exist together in the same component, or alternatively, they may exist in different components, respectively. The existence of an element described by a greater ordinal number does not essentially means the existent of another element described by a smaller ordinal number.

Moreover, in the present specification, the terms, such as "top", "bottom", "left", "right", "front", "back", or "middle", as well as the terms, such as "on", "above", "under", "below", or "between", are used to describe the relative positions among a plurality of elements, and the described relative positions may be interpreted to include their translation, rotation, or reflection.

Moreover, in the present specification, when an element is described to be arranged "on" another element, it does not essentially mean that the elements contact the other element, except otherwise specified. Such interpretation is applied to other cases similar to the case of "on".

Moreover, in the present specification, a value may be interpreted to cover a range within ±10% of the value, and in particular, a range within ±5% of the value, except otherwise specified; a range may be interpreted to be composed of a plurality of subranges defined by a smaller endpoint, a smaller quartile, a median, a greater quartile, and a greater endpoint, except otherwise specified.

Example 1

Figure 1:
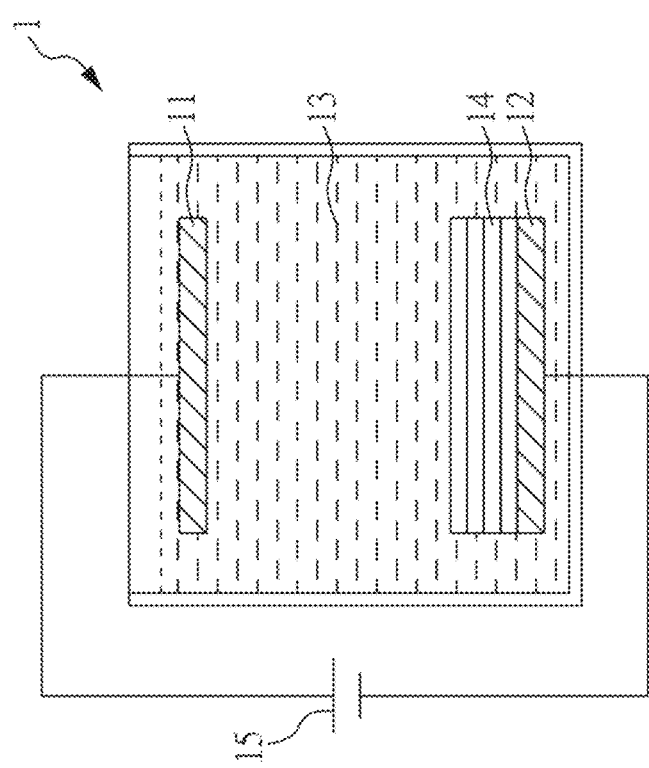
FIG. 1 is a schematic diagram showing an electrodeposition system used in the present disclosure.

FIG. 1 is a schematic diagram showing an electrodeposition system used in the present Example 1. The electrodeposition system 1 comprised: an anode 11 and a cathode 12 immersed into a plating solution 13 and respectively electrically connected to a direct current power supply 15. Herein, the anode 11 was a phosphorous copper bulk and the cathode 12 was a titanium substrate. The plating solution 13 comprised $CuSO_4$ (the Cu ion concentration being 30 g/L), HCl (the Cl ion concentration being 50 mg/L) and $H_2SO_4$ (100 g/L).

The electrodeposition was carried out with a direct current at a current density of 20 ASD for 6 seconds, and then with a direct current at a current density of 12 ASD for 300 seconds. The nano-twinned copper was grown on the surface of the cathode 12. The cathode 12 or the plating solution 13 was stirred at about 800 rpm. In addition, the thickness of the obtained nano-twinned copper layer 14 was about 10 μm.

Figure 2:
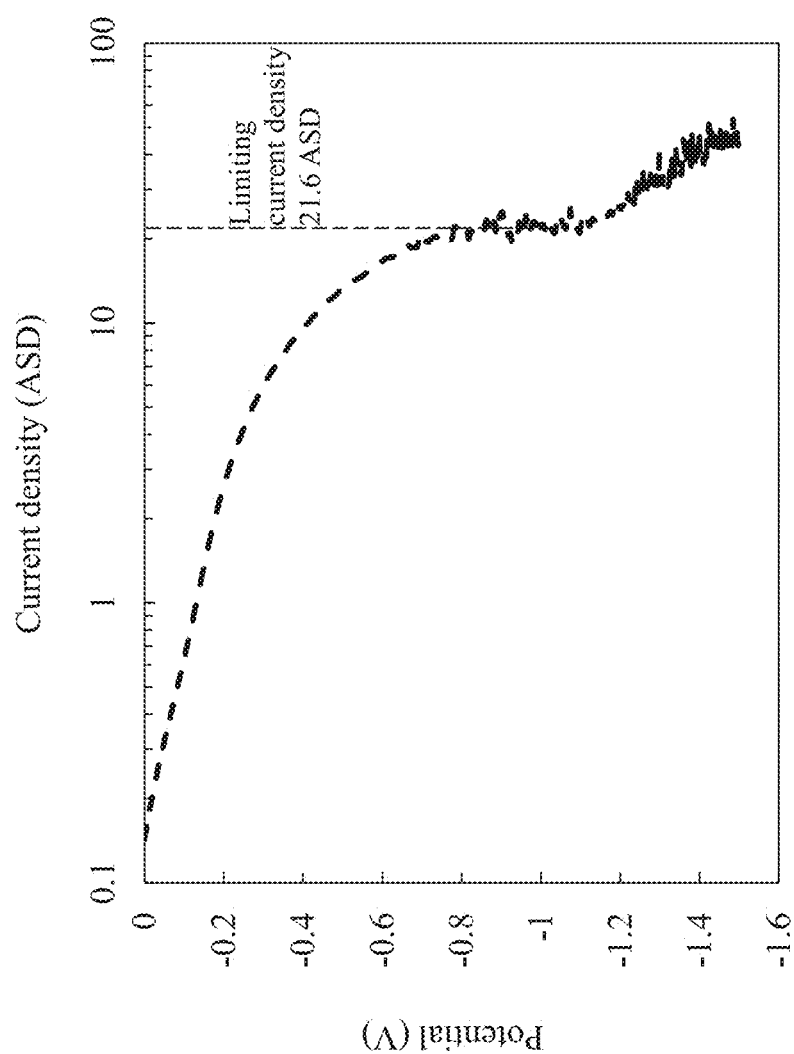
FIG. 2 is a plot of potential vs. current density of an electrodeposition system used in the present disclosure to measure the limiting current density of the electrodeposition system.

The current density of the electrodeposition system used herein was recorded at 800 rpm by continuously increasing the applied potential to obtain the limiting current density of the used electrodeposition system. The limiting current density of the used electrodeposition system was 21.6 ASD, as shown in FIG. 2.

Figure 3:
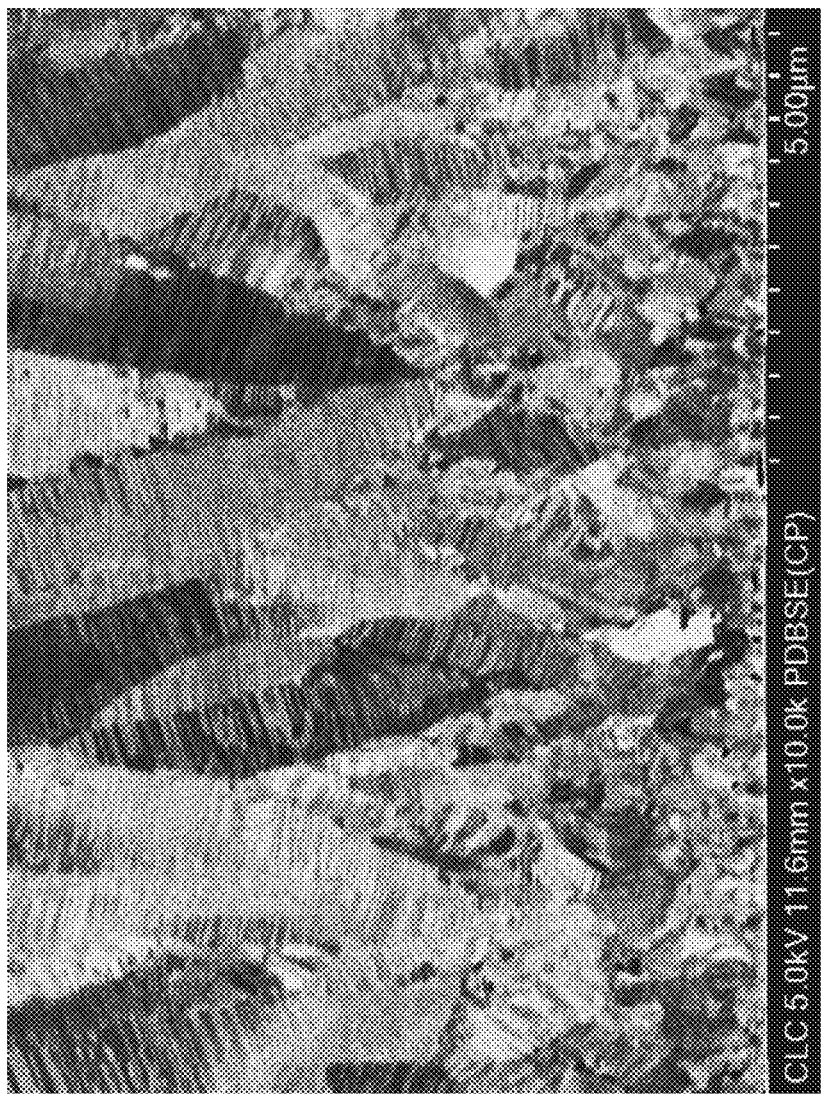
FIG. 3 is a cross-sectional focused ion beam photo of a nano-twinned copper layer prepared in Example 1 of the present disclosure.

FIG. 3 is a cross-sectional focused ion beam photo of a nano-twinned copper layer prepared in the present example. As shown in FIG. 3, in the obtained nano-twinned copper layer, over 50% of the volume of the nano-twinned copper layer comprises a plurality of columnar crystal grains, and the columnar crystal grains connect to each other. As shown in FIG. 3, the columnar crystal grains are formed by plural layered nano-twins, and the nano-twins extend to the surface of the nano-twinned copper layer. Thus, the (111) surface of the nano-twins is exposed on the surface of the nano-twinned copper layer. In the present example, all the surface of the nano-twinned copper layer is almost the (111) surface. In addition, the [111] crystal axis is an axis perpendicular to the (111) surface, and at least 70% of the columnar crystal grains are formed by the nano-twins stacking in an orientation of the [111] crystal axis. In the present example, almost all the columnar crystal grains are formed by the nano-twins stacking in the orientation of the [111] crystal axis.

In particular, as shown in FIG. 3, in the present example, the angle included between two adjacent columnar crystal grains is not 0°, but is greater 20° and less than or equal to 60°. In addition, lengths of the columnar crystal grains on a minor axis are respectively ranged from 0.5 μm to 3 μm, and thicknesses of the columnar crystal grains are respectively ranged from 2 μm to 5 μm.

Comparative Example 1

The process for growing the nano-twinned copper layer used herein is similar to that described in Example 1, except that the electrodeposition was directly carried out with a direct current at a current density of 12 ASD for 300 seconds.

Figure 4:
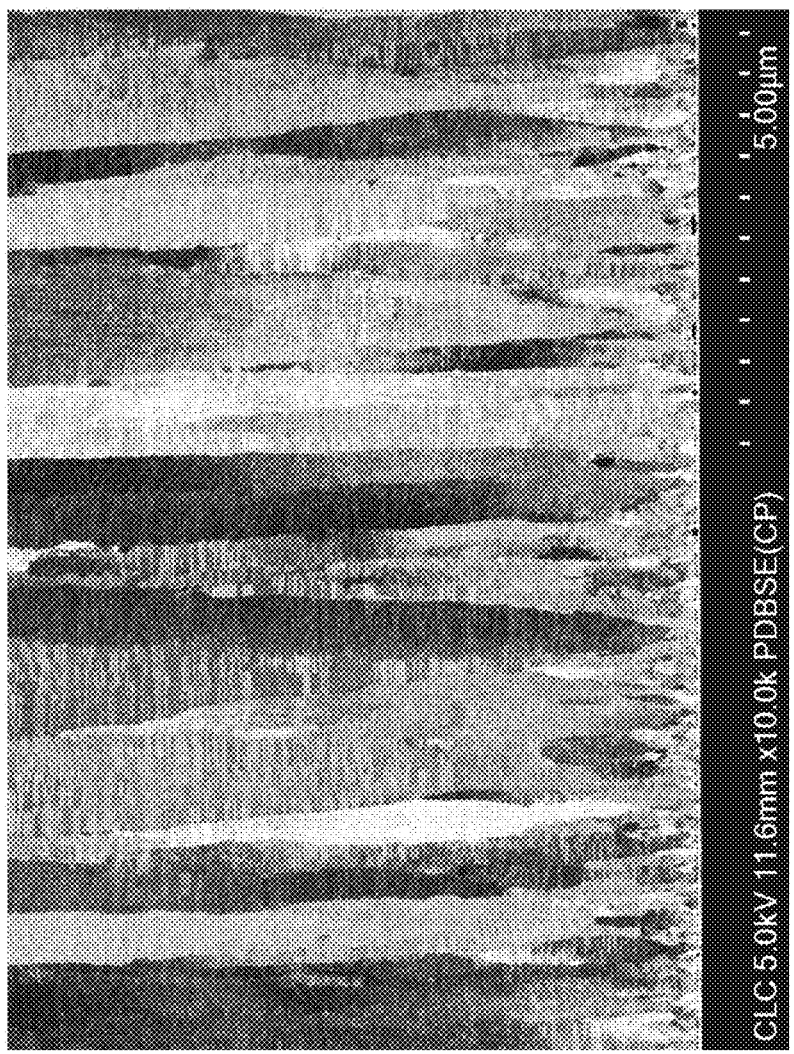
FIG. 4 is a cross-sectional focused ion beam photo of a nano-twinned copper layer prepared in Comparative example 1 of the present disclosure.

FIG. 4 is a cross-sectional focused ion beam photo of a nano-twinned copper layer prepared in the present comparative example. As shown in FIG. 3 and FIG. 4, the difference between the nano-twinned copper layers of Example 1 and Comparative example 1 is that the angle included between two adjacent columnar crystal grains is greater 20° and less than or equal to 60° in the nano-twinned copper layer of Example 1, but the angle included between two adjacent columnar crystal grains is close to 0° in the nano-twinned copper layer of Comparative example 1.

Tensile Test

The obtained nano-twinned copper layers were peeled off from the substrate and tested by IPC-TM-650 Test Method. The obtained nano-twinned copper layers were cut into strips with the 12.7 mm width and 150 mm length. INSTRON 4465 Tensile Testing Machine was used. Gauge length was set 50 mm, and the strain rate was set 5 nm/min.

TABLE 1

| | First current density, time | Second current density, time | Maximum tensile strength | Elongation rate |
|---|---|---|---|---|
| Example 1 | 20 ASD, 6 sec | 12 ASD, 300 sec | 606 MPa | 3.0% |
| Comparative example 1 | 12 ASD, 300 sec | — | 611 MPa | 1.2% |

Figure 5:
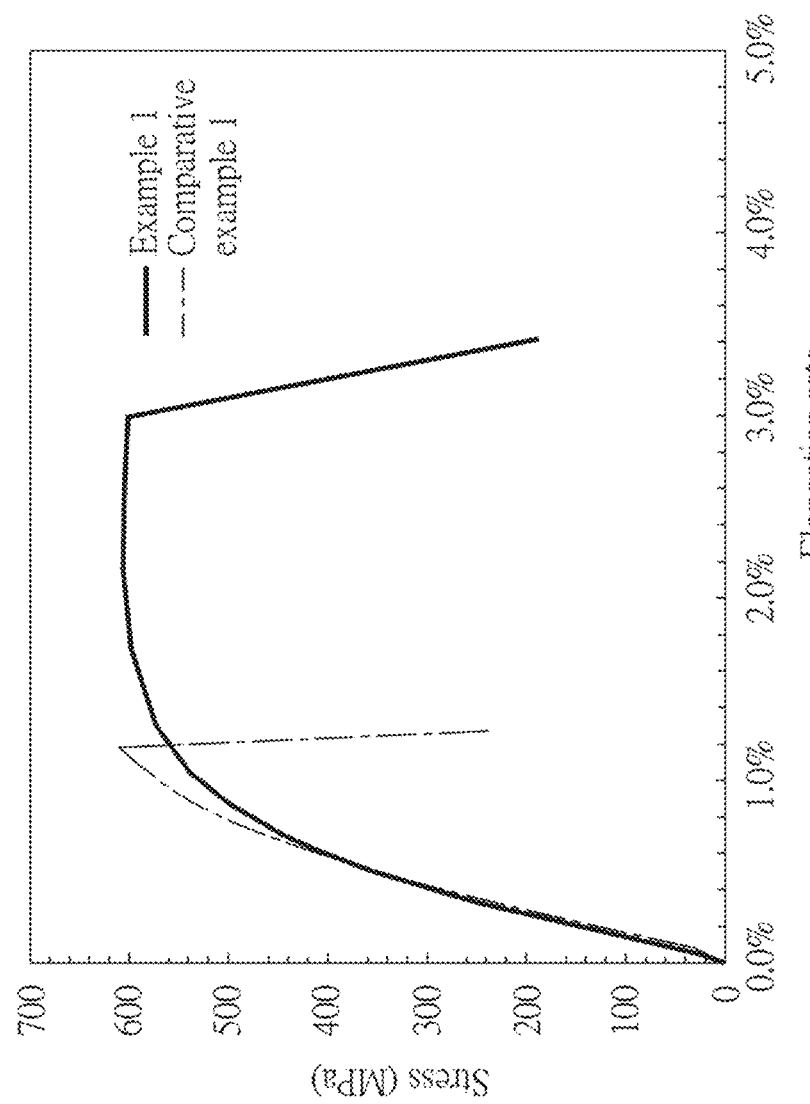
FIG. 5 is a plot of stress vs. elongation rate of nano-twinned copper layers prepared in Example 1 and Comparative example 1 of the present disclosure.

As shown in Table 1 and FIG. 5, compared to the nano-twinned copper layer of Comparative example 1, the nano-twinned copper layer of Example 1 has increased elongation rate.

Examples 2-5 and Comparative Example 2

The electrodeposition system used in Example 1 was used herein. The Cu ion concentration in the plating solution, the stirring rate and the temperature of the electrodeposition were adjusted to obtain different limiting current densities. The segmented electrodepositions with different current densities were used to obtain the nano-twinned copper layers of the present examples. The obtained nano-twinned copper layers were observed by their cross-sectional focused ion beam photos to check whether the angle included between two adjacent columnar crystal grains is greater 20° and less than or equal to 60°.

TABLE 2

| | First current density time | Second current density, time | Limiting current density | Angle included between two adjacent columnar crystal grains is greater 20° and less than 60° |
|---|---|---|---|---|
| Example 2 | 20 ASD, 6 sec | 4 ASD, 2500 sec | 21.6 ASD | Yes |
| Example 3 | 24 ASD, 8 sec | 12 ASD, 300 sec | 26.4 ASD | Yes |
| Example 4 | 80 ASD, 3 sec | 40 ASD, 30 sec | 98.5 ASD | Yes |
| Example 5 | 30 ASD, 2 sec | 12 ASD, 300 sec | 32.1 ASD | Yes |
| Comparative example 2 | 20 ASD, 6 sec | 12 ASD, 2500 sec | 26.4 ASD | No |

Example 6 and Comparative Example 3

Figure 6:
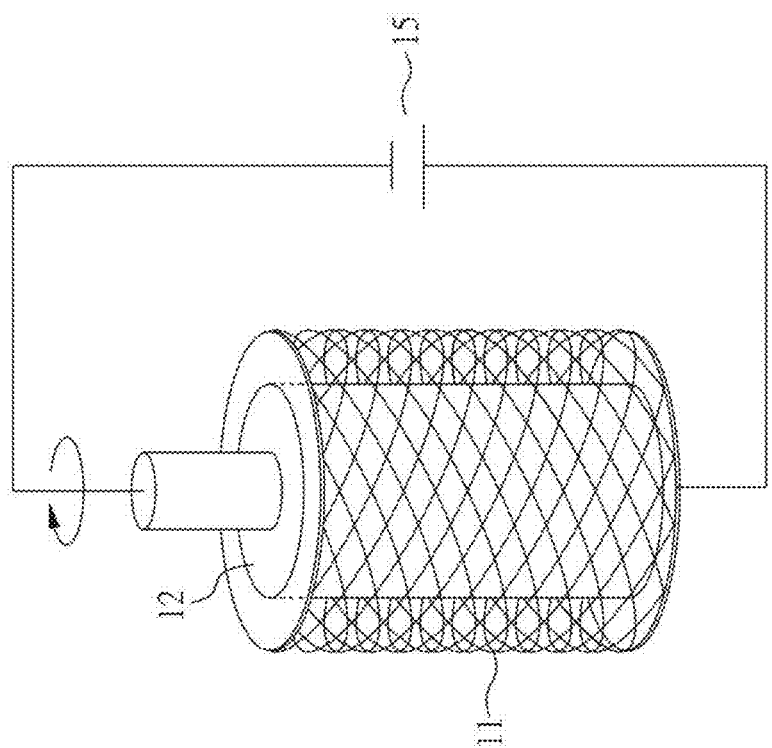
FIG. 6 is a schematic diagram showing another electrodeposition system used in the present disclosure.

FIG. 6 is a schematic diagram showing another electrodeposition system used in the present example and comparative example. The electrodeposition system comprised: an anode 11 and a cathode 12 immersed into a plating solution and respectively electrically connected to a direct current power supply 15. Herein, the anode 11 was a dimensional stable anode (DSA), which has a mesh structure and is formed by a Ti mesh coated with IrO$_2$. The cathode 12 was a rotated Ti roll. During the electrodeposition, the rotation rate of the cathode 12 was 800 rpm. The used plating solution comprised CuSO$_4$ (the Cu ion concentration being 60 g/L), HCl (the Cl ion concentration being 30 mg/L), H$_2$SO$_4$ (90 g/L) and lattice modification agent (2 ml/L). The temperature for electrodeposition was 50° C. The current density and time for electrodeposition are listed in the following Table 3.

Figure 7:
FIG. 7 is a cross-sectional focused ion beam photo of a nano-twinned copper layer prepared in Comparative example 3 of the present disclosure.
Figure 8:
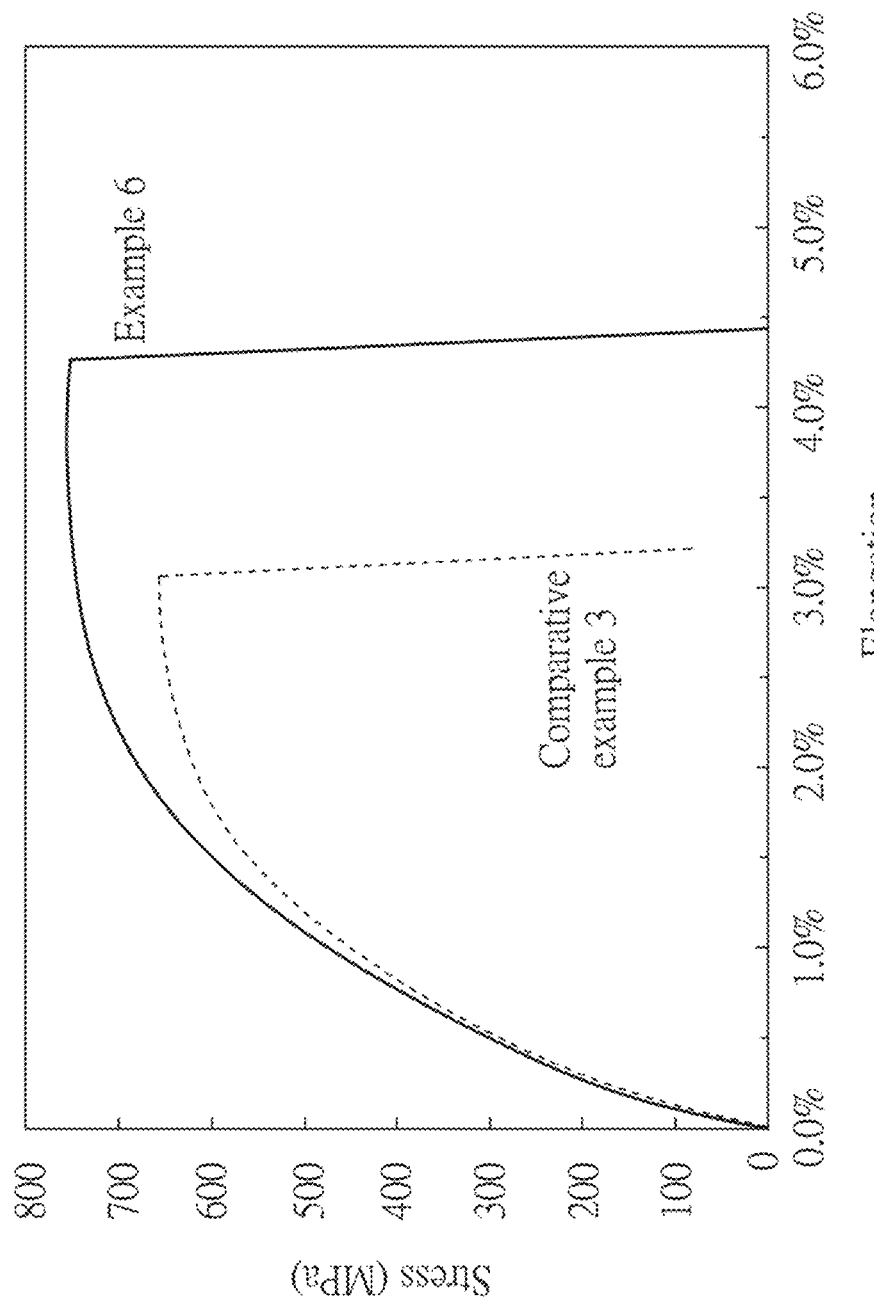
FIG. 8 is a plot of stress vs. elongation rate of nano-twinned copper layers prepared in Example 6 and Comparative example 3 of the present disclosure.

After electrodeposition, the nano-twinned copper was growth on the surface of the cathode 12, and the thicknesses of the obtained nano-twinned copper layers were about 12 µm. The obtained nano-twinned copper layers were peeled off and tested by the aforesaid tensile test and observed by metallographic observation. The results of the tensile test are shown in the following Table 3 and FIG. 8, and the cross-sectional focused ion beam photo of the nano-twinned copper layer prepared in Comparative example 3 is shown in FIG. 7.

TABLE 3

|  | First current density time | Second current density, time | Maximum tensile | Elongation rate |
|---|---|---|---|---|
| Example 6 | 60 ASD, 5 sec | 50 ASD, 72 sec | 756 MPa | 4.3% |
| Comparative example 3 | 60 ASD, 65 sec | — | 657 MPa | 3.1% |

The cross-sectional focused ion beam photo of the nano-twinned copper layer prepared in Example 6 (figure not shown) indicates that the angle included between two adjacent columnar crystal grains is greater 20° and less than or equal to 60°, and the crystal grains comprise nano-twins. However, the cross-sectional focused ion beam photo of the nano-twinned copper layer prepared in Comparative example 3 (as shown in FIG. 7) indicates that the obtained crystal grains are not columnar crystal grains and do not have preferred direction even though the crystal grains comprises nano-twins. In addition, the results of the tensile test shown in Table 3 and FIG. 8 indicate that the nano-twinned copper layer of Example 6 in which the nano-twinned columnar crystal grains are highly crossed has better tensile strength and elongation rate, compared to the nano-twinned copper layer of Comparative example 3 which has non-columnar nano-twinned crystal grains without preferred direction.

The nano-twinned copper layer of the present disclosure has the feature that the angle included between two adjacent columnar crystal grains is greater 20° and less than or equal to 60°. In addition, the nano-twinned copper layer of the present disclosure has improved elongation rate. Thus, the applications of the nano-twinned copper layer of the present disclosure can further be extended.

Although the present disclosure has been explained in relation to its embodiment, it is to be understood that many other possible modifications and variations can be made without departing from the spirit and scope of the disclosure as hereinafter claimed.

What is claimed is:

1. A nano-twinned copper layer, wherein over 50% of a volume of the nano-twinned copper layer comprises a plurality of columnar crystal grains, the plurality of columnar crystal grains connect to each other, at least 70% of the plurality of columnar crystal grains are formed by a plurality of nano-twins stacking in an orientation of a crystal axis, and an angle included between two adjacent columnar crystal grains is greater 20° and less than or equal to 60°, wherein an angle included between a direction of a longitude axis of one of the plurality of the columnar crystal grains and a thickness direction of the nano-twinned copper layer is greater than 20° but less than or equal to 60°.

2. The nano-twinned copper layer of claim 1, wherein a thickness of the nano-twinned copper layer is ranged from 0.1 µm to 500 µm.

3. The nano-twinned copper layer of claim 1, wherein each of the plurality of columnar crystal grains is formed by the plurality of nano-twins stacking in the orientation of the crystal axis.

4. The nano-twinned copper layer of claim 1, wherein lengths of the plurality of columnar crystal grains on a minor axis are respectively ranged from 0.1 µm to 50 µm.

5. The nano-twinned copper layer of claim 1, wherein thicknesses of the plurality of columnar crystal grains are respectively ranged from 0.01 µm to 500 µm.

6. A method for manufacturing a nano-twinned copper layer, comprising the following steps:
   providing an electrodepositing system, which comprises an anode, a cathode, a plating solution and a power supply, wherein the power supply is electrically connected to the anode and the cathode, and the anode and the cathode are immersed in the plating solution;
   performing electrodeposition at a first current density, which is 0.8 to 1.0 times of a limiting current density of the electrodepositing system; and
   performing electrodeposition at a second current density, which is 0.1 to 0.6 times of the limiting current density of the electrodepositing system, to grow a nano-twinned copper layer on a surface of the cathode,
   wherein over 50% of a volume of the nano-twinned copper layer comprises a plurality of columnar crystal grains, the plurality of columnar crystal grains connect to each other, at least 70% of the plurality of columnar crystal grains are formed by a plurality of nano-twins stacking in an orientation of a crystal axis, and an angle included between two adjacent columnar crystal grains is greater 20° and less than or equal to 60°, wherein an angle included between a direction of a longitude axis of one of the plurality of the columnar crystal grains and a thickness direction of the nano-twinned copper layer is greater than 20° but less than or equal to 60°.

7. The method of claim 6, wherein a time for the electrodeposition at the first current density is ranged from 1 second to 20 seconds.

8. The method of claim 6, wherein the electrodeposition is carried out by direct current electrodeposition, pulse electrodeposition, or both interchangeably.

9. The method of claim 6, wherein the cathode is a substrate with a metal layer formed thereon or a metal substrate.

10. The method of claim 9, wherein the substrate is a silicon substrate, a glass substrate, a quartz substrate, a metal substrate, a plastic substrate, a printed circuit board, a III-V group material substrate, or a laminated substrate thereof.

11. A substrate with a nano-twinned copper layer, comprising:
   a substrate; and
   a nano-twinned copper layer disposed on a surface of the substrate or embedded in the substrate,
   wherein over 50% of a volume of the nano-twinned copper layer comprises a plurality of columnar crystal grains, the plurality of columnar crystal grains connect to each other, at least 70% of the plurality of columnar crystal grains are formed by a plurality of nano-twins stacking in an orientation of a crystal axis, and an angle included between two adjacent columnar crystal grains is greater 20° and less than or equal to 60°, wherein an angle included between a direction of a longitude axis of one of the plurality of the columnar crystal grains and a thickness direction of the nano-twinned copper layer is greater than 20° but less than or equal to 60°.

12. The substrate of claim 11, wherein the substrate is a silicon substrate, a glass substrate, a quartz substrate, a metal substrate, a plastic substrate, a printed circuit board, a III-V group material substrate, or a laminated substrate thereof.

13. The substrate of claim 11, wherein a thickness of the nano-twinned copper layer is ranged from 0.1 μm to 500 μm.

14. The substrate of claim 11, wherein each of the plurality of columnar crystal grains is formed by the plurality of nano-twins stacking in the orientation of the crystal axis.

15. The substrate of claim 11, wherein lengths of the plurality of columnar crystal grains on a minor axis are respectively ranged from 0.1 μm to 50 μm.

16. The substrate of claim 11, wherein thicknesses of the plurality of columnar crystal grains are respectively ranged from 0.01 μm to 500 μm.

* * * * *